Dec. 4, 1962 J. J. EACHUS 3,067,336

BISTABLE ELECTRONIC SWITCHING CIRCUITRY FOR MANIPULATING DIGITAL DATA

Filed May 3, 1957 3 Sheets-Sheet 1

INVENTOR.
J. J. EACHUS
BY Henry L. Hanson
ATTORNEY

Dec. 4, 1962 J. J. EACHUS 3,067,336

BISTABLE ELECTRONIC SWITCHING CIRCUITRY FOR MANIPULATING DIGITAL DATA

Filed May 3, 1957 3 Sheets-Sheet 2

INVENTOR.
J. J. EACHUS
BY Henry L. Hanson
ATTORNEY

INVENTOR.
J. J. EACHUS
BY Henry L. Hanson
ATTORNEY

United States Patent Office 3,067,336

Patented Dec. 4, 1962

3,067,336

BISTABLE ELECTRONIC SWITCHING CIRCUITRY FOR MANIPULATING DIGITAL DATA

Joseph J. Eachus, Cambridge, Mass., assignor, by mesne assignments, to Minneapolis-Honeywell Regulator Company, a corporation of Delaware Filed May 3, 1957, Ser. No. 656,791
25 Claims. (Cl. 307—88.5)

A general object of the present invention is to provide a new and improved pulse handling and storing circuit. More particularly, the present invention is concerned with a new and improved circuit for handling, storing and transferring digital data where this circuit is characterized by its flexibility and adaptability for use in the logical design and implementation of digital data handling circuits.

Static bistable circuits such as static flip-flops or bistable multivibrators and the like, have been widely used in computer circuits, particularly where parallel data handling techniques are employed. The pulse handling circuitry heretofore known has been lacking in flexibility and utility and has often been extremely critical in terms of ease of design and production. This has been particularly true in circuitry employing semi-conducting devices such as transistors as the circuit amplifying elements.

In a co-pending application by the present inventor entitled "Electrical Apparatus" bearing Serial Number 614,839, filed October 9, 1956 now issued as Patent No. 2,986,652, on May 30, 1961, there is disclosed a new type of signal gating or switching circuit. This circuit employs a pair of semi-conductor devices connected in a signal controlling configuration, said devices having different thresholds of conduction. In a preferred form, these semi-conductor devices comprise a germanium diode and silicon diode so arranged in a circuit that if the germanium diode is conducting current, a potential point in the circuit to which the silicon diode is connected will have a voltage thereon which is less than the voltage necessary to exceed the conducting threshold of the silicon diode and consequently there will be no signal on the output of the circuit. Conversely, if the germanium diode is not conducting, the silicon diode is arranged so that the potential point to which it is connected will have a voltage thereon which is above the conducting threshold and thereby a signal will appear in the output of the circuit.

In addition to the signal gating and buffering configurations to which the foregoing circuit is adapted, the circuit has further been found to be well adapted to other forms of digital handling circuits, particularly bistable circuits and circuits directly associated therewith.

It is, therefore, a more specific object of the present invention to provide a new and improved bistable circuit employing a plurality of signal gating circuits using semi-conductor devices whose conducting thresholds are dissimilar.

A further more specific object of the present invention is to provide, for use with a bistable circuit, a signal controlling circuit utilizing a silicon-germanium diode configuration for establishing the desired signal transfer relationship within and without the bistable circuit.

In addition to the foregoing, the present circuit has been found particularly adapted to other basic types of data handling techniques. For example, it has been found desirable to provide a two bus signal transfer circuit in combination with a plurality of static bistable devices with the bistable devices being arranged in parallel with respect to the two signal busses. In this type of circuit, it is desired that the signal stored in one of the bistable devices be transferred in any desired direction on the busses to be stored in one or more of the other devices. Further in certain forms of the apparatus, it is desired to transfer information stored in one bistable device in complemented form into a further device or devices. In all of the foregoing types of circuits, the bistable circuit into which information is inserted is readily addressable to thereby enhance the adaptability of this type of circuit for use in designing digital circuitry. An important requirement in a two bus system of the present type is that the inactive devices connected to the busses do not load down the active circuits. The present invention meets this requirement.

It is, therefore, a further more specific object of the invention to provide a two bus data handling circuit where a plurality of bistable devices have their inputs and outputs connected in parallel with respect to the signal transfer busses.

A further more specific object of the present invention is to provide a two bus signal transfer circuit utilizing a plurality of addressable bistable circuits having input and readout signal control circuits adapted to enhance the ability of the circuit to perform logical functions.

In another form of the present invention, the bistable circuit is adapted for use in a binary flip-flop configuration. It is desired in this type of configuration that the application of a series of input signal pulses will cause the bistable circuit to switch from one bistable state to the other even though the signals are applied to a single input terminal. This latter type of function is achieved in the present invention by a novel arrangement of the aforediscussed bistable circuit in combination with a delay circuit in the signal coupling circuit which is adapted to effect the desired transfer of the operating condition of the circuit from one state to the other.

Accordingly it is a further more specific object of the present invention to provide a new and novel binary flip-flop utilizing a new and novel electrical circuit configuration including a plurality of semi-conducting devices having different thresholds of conduction.

The binary flip-flop circuit configuration is further adapted to be modified to perform storage register functions such as have been previously performed by other types of electronic shift registers. This latter type of function is achieved in the present circuitry by connecting a series of bistable flip-flop circuits so that the application of an input signal to one of the circuits will effect a desired transfer of information into the next flip-flop on the series. This type of circuit is realized in the present invention by the application of the novel switching circuit using semi-conducting devices having different thresholds of conduction.

It is therefore a still further object of the present invention, in accordance with the foregoing discussion, to provide a new and improved electronic shift register employing circuitry embodying switching circuits including semi-conductor devices having different thresholds of conduction.

The output of a flip-flop is generally in the form of a DC signal step and as such is sometimes required to be modified in the form of a pulse. This is most readily accomplished by means of a differentiating circuit. This differentiation is accomplished in the present invention by again employing the novel switching circuit that includes a pair of semi-conductor devices having different thresholds of conduction with a suitable delay element interposed in the switching circuit to provide the desired differentiation.

It is therefore a further object of the invention to provide a new and improved signal gating circuit employing a pair of similar semi-conductor devices having an impedance connected in series therewith to delay the signal transfer of the circuit.

The various features of novelty which characterize the invention are pointed out with particularity in the claims annexed to and forming a part of the present specification. For a better understanding of the invention, its advantages, and specific objects attained with its use, reference should be had to the accompanying drawings and descriptive matter in which there are illustrated and described preferred embodiments of the invention.

Figure 1:
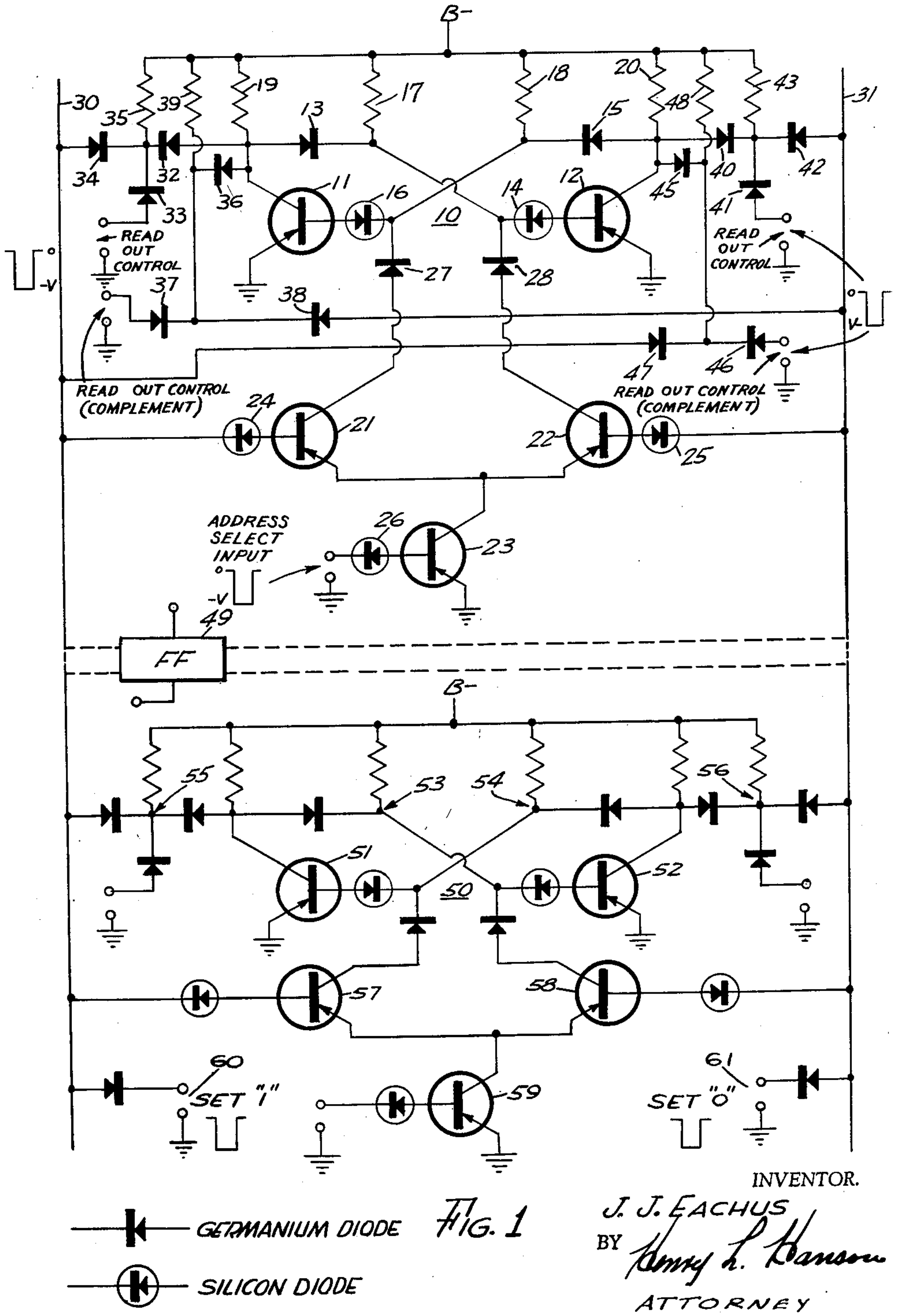
FIGURE 1 is a schematic showing of a preferred form of the present invention applied to a two bus single transfer circuit.

Referring first to FIGURE 1, the numeral 10 represents a bistable flip-flop or multivibrator which is shown to include a pair of transistor devices 11 and 12, the latter having the usual base, emitter, and collector electrodes. Connected between the collector electrode of the transistor 11 and the base of the transistor 12 are a pair of diodes 13 and 14. The diode 13 is selected so as to have a conducting threshold which is less than the conducting threshold of the diode 14. This can be achieved, for example, by using a germanium diode for the diode 13 and a silicon diode for the diode 14. While the present circuitry will be described in connection with the germanium and silicon diodes, it should be understood that other types of diodes may be used to advantage so long as they exhibit in combination the characteristics of differing thresholds of conduction.

In a similar manner, the collector electrode of the transistor 12 is connected by way of a diode 15 and a further diode 16 to the base electrode of the transistor 11. A resistor 17 is connected between the junctions of the diodes 13 and 14 and a negative power supply terminal B minus. A further resistor 18 is coupled between the junction of the diodes 15 and 16 to the same B minus terminal.

The power supply for the transistor 11 is supplied by way of a resistor 19 connected between the B minus terminal and the collector electrode of the transistor 11. The emitter electrode of the transistor 11 is connected to ground. In a similar manner, power is supplied to the transistor 12 by way of a resistor 20, the latter being connected to the B minus terminal and the collector electrode of the transistor 12. The emitter electrode of the transistor 12 is grounded.

The input circuit to the bistable circuit 10 is provided by a further series of transistors 21, 22 and 23 connected in a parallel-series relationship with respect to the input of the bistable circuit 10. Each of the transistors 21, 22 and 23 include the usual base, emitter, and collector electrodes. Input signals may be connected to the base electrodes of either of the transistors 21 or 22 by way of their respective input diodes 24 and 25. The activating of the inputs for permitting an input through either of the transistors 21 or 22 is accomplished by an input signal applied through a further diode 26 on the input of transistor 23.

The output from the transistors 11 and 12 is adapted for selective application to a pair of signal busses 30 and 31. This output is achieved by way of a pair of gating circuits on the output of each of the transistors 11 and 12. The gating circuit to the output line 30 from transistor 11 is by way of a circuit including the diodes 32 and 33 connected in an "AND" gate configuration and an output diode 34. Connected to the junction between the diodes 32 and 34 is a resistor 35 which in turn connects to the B minus terminal. A further gating circuit connects the output of the transistor 11 to the signal bus 31.

In this latter circuit, the gating circuit includes a diode 36 and a diode 37 connected in a gating circuit configuration with an output diode 38, the latter of which connects directly to the output signal bus line 31. A resistor 39 is connected to the junction point of the diodes 36 and 37 at one end and to the B minus terminal at the other end.

In a similar manner, the output of the transistor 12 is also connected to the output signal busses 30 and 31 by way of a pair of gating circuits. The gating circuit leading to the line 31 comprises a pair of gating diodes 40 and 41, an output diode 42. The junction between the diodes 40 and 41 is connected to the B minus terminal by way of a further resistor 43. The output of the transistor 12 is also coupled to the signal line 30 by way of a gating circuit including the diode 45 and a further diode 46 connected in a gating configuration with an output diode 47. Resistor 48 connects the junction of the diodes 45 and 46 to the B minus terminal.

A number of similar bistable circuits of the type illustrated in connection with a bistable circuit 10 may be connected to the signal lines 30 and 31. One such flip-flop or bistable circuit has been illustrated in block form at 49. A further schematic for a bistable circuit is similarly illustrated at 50. Each of the additional bistable circuits are preferably formed in the same general manner in which the circuit 10 is formed. Thus, for example, the bistable circuit 50 may be arranged to comprise a pair of transistors 51 and 52 having a pair of cross-coupling circuits 53 and 54 arranged for switching the bistable state in the circuit. In addition, a diode gating circuit is connected in the output circuit to the transistor 51 at 55. A further diode gating circuit is connected to the output of the transistor 52 at 56. The input to the circuit is achieved by way of a further pair of transistor devices 57 and 58 operating with a further transistor 59.

For purposes of illustration, a pair of input terminals 60 and 61 are shown connected to the signal buses 30 and 31 to provide an input signal source for the respective bistable circuits. It will be apparent from the description that follows that there are numerous configurations that may be used for supplying the signals to the signal busses 30 and 31.

Before considering the over-all operation of the circuit of FIGURE 1, the operation of the various gating circuits is considered. Diode 16 on the input base of transistor 11 is a silicon diode whose threshold of conduction is about twice that of either of the germanium diode 27 and 15 connected thereto. If the anode end of either of the diodes 27 or 15 is connected to ground by way of the transistor 21 or transistor 12 respectively, the potential on the cathode of the silicon diode 16 will be less than that which is necessary to cause the diode 16 to conduct. This potential will be determined by the potentials in a circuit such as the one leading from ground through the emitter-collector circuit of transistor 12, diode 15, and resistor 18 to the B− supply terminal. The potential on the cathode of germanium diode 15 will be less than that necessary for the silicon diode 16 to conduct. Consequently, the base of transistor 11 will be at substantially ground potential and therefore non-conducting.

If the transistor 12 is switched to the non-conducting state, the potential on the cathode of diode 16 will rise to a point above its conducting threshold and the transistor 11 will be biased negative on its base and switched into the conducting state. The input gating for each of the transistors shown in FIGURE 1 operates in the same general manner and will be further understood by reference to the above-mentioned patent.

The gating circuits for readout are of the same general type. By way of example, the diodes 32 and 33 are associated with a normal readout of the "set" condition of the transistor 11. When "set," transistor 11 will be non-conducting so that the collector electrode thereof will be at substantially B− potential. By applying a readout signal to the diode 33, which may take the form of open-circuiting the diode 33 conducting circuit, the potential on the cathode of diode 33 will go negative toward the B− potential This negative potential is coupled to the line 30 by way of the diode 34 so that when another circuit, such as transistor 57 is addressed by transistor 59, a switching signal will be coupled to the base of transistor 57 by way of the silicon diode on the input thereof. Thus, the silicon diode will have its threshold of conduction exceeded by the negative potential on the line 30 so that the transistor 57 can now conduct. The readout gate circuits for each of the other transistors will function in the manner set forth above.

In considering the operation of FIGURE 1, it is first assumed that it is desired to set the bistable circuit 10 into the "one" state. The "one" state is defined herein as being that state when the transistor 11 is nonconducting and transistor 12 is conducting. When it is desired to set the bistable circuit 10 into the "one" state, a negative pulse will be applied to the input terminals 60 so that the negative pulse will be on the signal line 30. With the negative pulse on the signal line 30, a negative pulse will be applied through the diode 24 to the base electrode of the transistor 21. In order to complete the setting of the bistable circuit 10, a further negative pulse must be applied to the addressing line input through diode 26 to the base electrode of the transistor 23. With a negative control signal on the base electrodes of the transistors 21 and 23, these two transistors will become conductive. With both of the transistors 21 and 23 in a conductive state, it is possible for a current flow path to extend from the ground terminal through the emitter-collector circuit of the transistor 23, the emitter-collector circuit of the transistor 21, the isolation diode 27, and resistor 18 to the B minus power supply terminal. Inasmuch as the circuit from the lower terminal resistor 18 to ground has substantially no resistance therein, the right hand terminal of the diode 16 will be at ground potential and this will mean that the base electrode of the transistor 11 will be at substantially ground potential. If the transistor 11 were in a conducting state it will now be switched to a non-conducting state. When the transistor 11 is not conducting, the potential of the collector-electrode, which is the output electrode in the present circuit, will be at substantially the B minus potential. This will mean that the diode 13 will be nonconducting and the potential on the input diode 14 on the input of the transistor 12 will have a negative potential, represented by the B minus potential, applied hereto. This negative potential will be such as to cause the transistor 12 to be biased into the conducting state. When in the conducting state, the emitter-collector circuit of the transistor 12 will be connecting the lower terminal of the resistor 20 to substantially ground potential. With the lower terminal of resistor 20 at ground potential, the diode 15 will be conducting so that the potential at the lower end of resistor 18 will also be at substantially ground potential. This will serve to hold the potential on diode 16 below the conducting threshold point so that transistor 11 will also remain non-conducting.

Once the apparatus is in a particular bistable state, it will remain in that state, under normal conditions of operation, until such time as a signal is applied to the input to transfer the bistable state from one state to the other.

Should it be desired to set the bistable circuit 10 into the zero state it is necessary to apply a negative pulse to the input terminal 61 and to the input of the transistor 23 by way of diode 26. The negative signal pulse on the input terminal 61 will result in a negative signal being applied to the base electrode of the transistor 22 by way of the diode 25. With a correspondingly timed negative pulse on the base electrode of the transistor 23, a conductive circuit will be established on the ground terminal through the emitter-collector circuit of the transistor 23, the emitter-collector circuit of the transistor 22, the coupling diode 28, and resistor 17 of the B minus terminal.

With the last described circuit completed, the lower terminal of the resistor 17 will be substantially at ground potential and consequently the base electrode of the transistor 12 will be at ground potential to render this transistor nonconducting. With the transistor 12 nonconducting, the potential on the collector-electrode will approach that of the B minus terminal. With this potential on the B minus terminal on the lower end of resistor 20, a similar potential condition will exist on the lower terminal of the resistor 18 to thereby supply a negative biasing potential sufficient in amplitude to cause the diode 16 to apply a negative signal to the base of the transistor 11. This will render the transistor 11 conducting so that now the bistable circuit is set into the "zero" state. With transistor 11 conducting, the lower terminal of resistors 17 and 19 will be at substantially ground potential so that the diode 14 will be non-conducting and transistor 12 will also be held non-conducting.

Once a particular bistable circuit, such as the circuit 10, 49, or 50, has been set at a particular bistable state, it is possible to transfer that state to any other bistable circuit of the series by the appropriate selection of signals on the control terminals of the various circuits involved. For example, assume the bistable circuit 10 has been set into the "one" state so that the transistor 11 is nonconducting and the transistor 12 is conducting. Further, it is assumed that it is desired to transfer this state from the bistable circuit 10 to the bistable circuit 50. With the transistor 11 nonconducting, there will be a negative signal on the gating diode 32. In order to read out from this circuit 10, it is necessary to apply a negative read out signal to the diode 33. If the signals applied to the diodes 32 and 33 are both negative, a negative signal will be applied to the transfer bus 30. With a negative potential on the lead 30, and if a signal is applied to the input of the address selection transistor 59 of the circuit 15, the transistors 57 and 59 will be rendered conducting to thereby apply a grounding potential to the input of the transistor 51. This will in turn cause the tranistor 51 to be switched to a nonconducting state if it is not already in that state. With the transistor 51 switched to the nonconducting state, the transistor 52 will be switched to the conducting state so that now the bistable circuit 50 will be set to the "one" state as defined in the bistable circuit 10.

It will be readily apparent that while this read out is taking place, there has been no destruction of the information stored in the bistable circuit 10.

It will be readily apparent that the information stored in the bistable circuit 50 may likewise be transferred to one or more of the other bistable circuits connected as are the circuits 10 and 49 to the two signal busses 30 and 31.

The aforedescribed transfer of the bistable circuit 10 and the bistable circuit 50 was made in the normal manner so the "one" state was transferred from one bistable circuit to the other. Under certain circumstances, it is desired to transfer the complement of the information stored in one circuit to a further circuit. Thus, it may be desired to transfer the "one" state in the bistable circuit 10 to complement form to the bistable circuit 50 in which case it will be desired to set the bistable circuit 50 to the "zero" state. This complementing of information may be accomplished by applying a readout pulse to the complementing input of the readout diode 37. If the bistable circuit 10 is set in the "one" state, a negative signal will be applied to the input of diode 36 and a negative potential will be applied to the output of the signal line 31 by way of the output diode 38. This negative potential on the line 31 will co-operate with a negative readin signal on the input of the transistor 59 to render both the transistors 58 and 59 in the conductive state to thereby apply an effective ground to the input of the base electrode of the transistor 52. This will render the transistor 52 nonconductive and will further cause the transistor 51 to switch to the conducting state. When switched as described, the bistable circuit 50 will now be set to the "zero" state which is the complement of the state of the bistable circuit 10.

In a similar manner, the "zero" state stored in the bistable circuit 10 may be complemented and written into the bistable circuit 50 as a "one" by utilizing the aforedescribed signal logic on the terminals of the circuit.

In the operation of this circuit, the operation has been considered solely in connection with the application of a pulse to the diodes 33 and 37. It is possible for a signal applied to the diode 33 to be simultaneously applied to the diode 41 when a normal readout is desired. Further, it is possible to apply a readout signal to the complementing diode 37 and to the complementing diode 46 at the same time and with the same signal source.

It will be noted that the bistable circuit 50 does not show a complementing circuit in connection therewith. It will be readily apparent that the inclusion of such a complementing gating circuit, as used in conjunction with the bistable circuit 10, may be added to the circuit 50 and when so added, the circuit will function in the same manner as aforedescribed in connection with the circuit 10.

It will also be apparent in the aforedescribed circuit that the inactive portion of the circuit does not load the signal busses 30 and 31. Consequently, the number of flip-flops used with any two busses may be governed by the requirements of a circuit logical designer.

Figure 2:
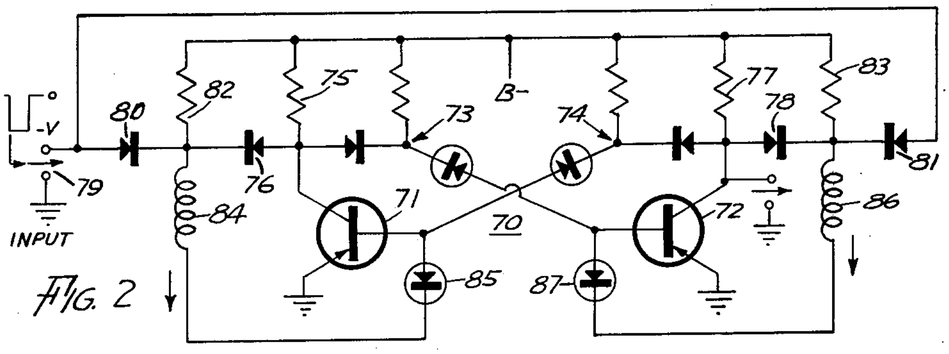
FIGURE 2 illustrates the present invention utilized in a binary flip-flop configuration.

Referring now to FIGURE 2 there is here shown a binary flip-flop including a bistable circuit 70 having a pair of transistors 71 and 72. The transistors 71 and 72 have the usual base, emitter and collector electrodes and are cross-connected by way of a pair of coupling circuits 73 and 74 in a manner similar to that described in conjunction with the bistable circuits 10 and 50 of FIGURE 1.

Connected to the collector electrode of the transistor 71 is a load resistor 75, a diode 76, and one terminal of a coupling circuit 73 which leads to the base electrode of the transistor 72. Connected to the collector electrode of the transistor 72 is a load resistor 77, a diode 78, and one end of the cross-coupling circuit 74, the other end of which is connected to the base electrode of the transistor 71.

A pair of input terminals 79 are arranged for connection through a diode 80 and a further diode 81 to the diodes 76 and 78 respectively. Connected to the junction of the diode 76 and 80 is a resistor 82 while connected to the junction of the diode 81 and 78 is a resistor 83.

An input coupling circuit is arranged to couple the potential on the lower terminal of resistor 82 to the base electrode of the transistor 71 and this circuit includes an inductor 84 and a diode 85. Connected to the lower terminal of the resistor 83 is a further coupling circuit in the form of an inductor 86 and a diode 87, the latter being connected to the base electrode of the transistor 72.

In the absence of any input signals, the bistable circuit 70 will be in one state or the other depending upon the initial static unbalance in the circuit. It is first assumed here that the transistor 71 is nonconducting and that the transistor 72 is conducting. With the transistor 71 nonconducting, the potential at the lower end of the resistor 75 will be substantially that of the B minus power supply terminal. With the transistor 72 conducting, the potential at the lower end of the resistor 77 will be at substantially ground potential. The circuit will remain in this state of unbalance until such time as an input pulse is received. The input pulse used in this circuit is a negative pulse on the input terminal 79 and will be applied simultaneously by way of the diodes 80 and 81 to the inputs of the two sections of the bistable circuit. With a negative pulse applied through the diode 80, the potential at the lower end of the resistor 82 will become negative. With this negative potential present, it will be reflected through the inductor 84 and the diode 85, the latter being a silicon diode, to the base electrode of the transistor 71. With a negative potential applied to the transistor 71, the transistor will become conductive and therefore the potential at the lower end of the resistor 75 will go to ground potential. With the potential at the left end of the coupling circuit 73 at ground, the base electrode of the transistor 72 will no longer have a sufficiently negative signal supplied thereto and this transistor will then become cut off. While the negative input pulse on the input terminals 79 will also be applied through the diode 81 to the lower end of the resistor 83, this will initially have no effect upon the circuit for at the time that the pulse is received, the transistor 72 is conducting and therefore the left end of the diode 78 will be at ground potential. Inasmuch as the diode 78 and 81 form a gating circuit, it is necessary that both of the diodes have a negative potential applied thereto before a signal pulse will be applied through the inductor 86 to the base electrode of the transistor 72.

Each of the inductors 84 and 86 functions as current-sustaining elements during the transition period of the circuit. Thus, when a current signal is initiated in the circuit by way of the inductor 84, diode 85 and the base-emitter circuit of transistor 71, the inductor will tend to sustain that current flow for a period long enough to ensure switching of the circuit. The inductor 86 also serves to provide the same function on the input of transistor 72.

With the bistable circuits 70 now switched so that the transistor 71 is conducting and the transistor 72 is cut off, the application of the next input negative pulse in the input terminal 79 will have the effect of switching the circuit back to its initial stable state. Upon the receipt of the next subsequent input pulse, the gating circuit including the diodes 78 and 81 will be conditioned to pass a negative switching pulse through the inductor 86 and diode 87 to the base electrode of the transistor 72 to cause the transistor 72 to switch to the conducting state. As this transistor is switched to the conducting state, the lower terminal of the resistor 77 will be switched to substantially ground potential and there will be a consequent grounding signal coupled through the network 74 to the base of the transistor 71 so that this transistor will now be cut off.

It will be readily apparent from the foregoing description that the apparatus will continue to switch back and forth between the two stable states of the circuit as long as the negative input pulses are received on the input terminals 79. It will be further apparent that this type of binary circuit is especially adapted for use in many types of logical configurations in digital data handling circuitry, such as counters and the like.

Figure 3:
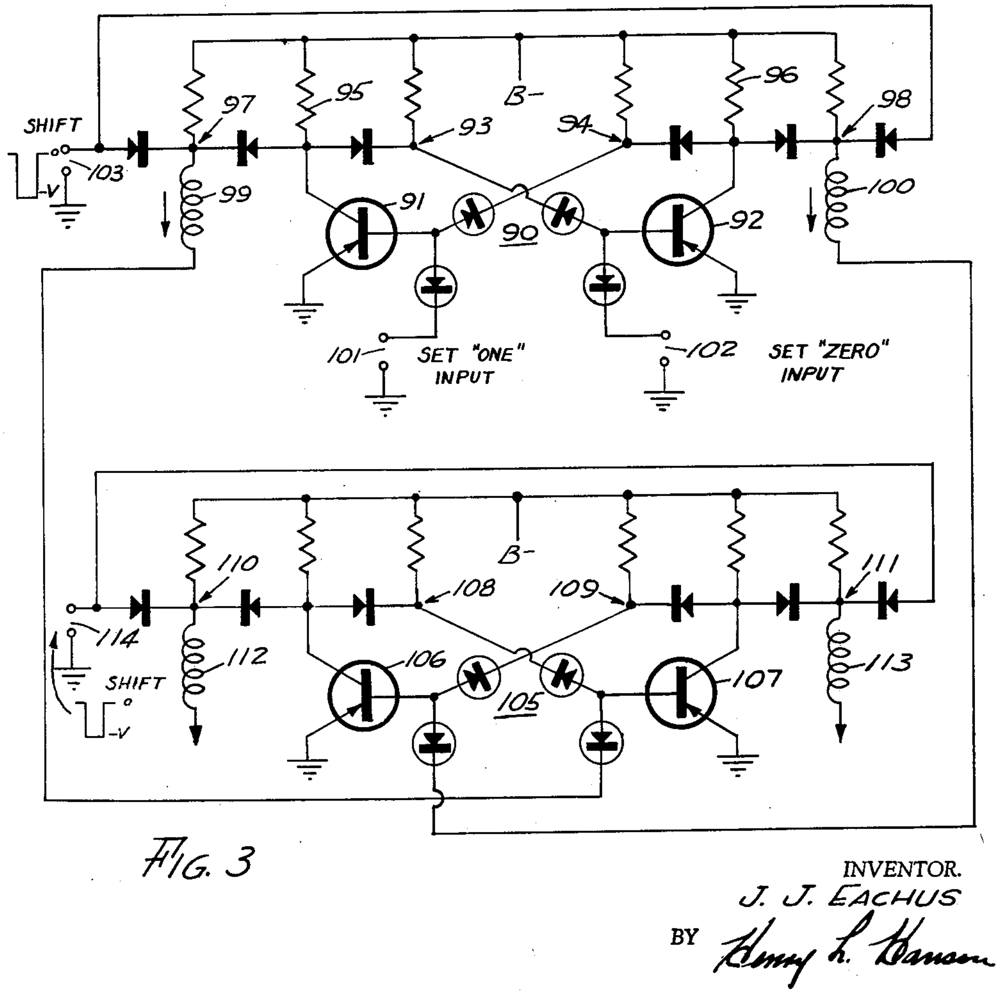
FIGURE 3 illustrates how the present invention may be adapted for use with an electronic shift register.

The basic binary flip-flop type of circuitry illustrated in FIGURE 2 is also readily adapted for use with slight modifications in a shift register of the electronic type. Such a circuit is illustrated in FIGURE 3. In an electronic shift register of the type illustrated, it is desired that information stored in one bistable circuit be shifted through the register which includes a plurality of bistable circuits, with the shifting taking place one bistable circuit at a time.

Referring more specifically to FIGURE 3, there is here illustrated a first bistable circuit 90 which comprises a pair of transistor devices 91 and 92, each having the usual base, emitter, and collector electrodes. Connected between the collector electrode of the transistor 91 and the base electrode of the transistor 92 is a coupling circuit 93, the latter incorporating the two diodes of dissimilar thresholds of conduction. Coupled between the collector electrode of the transistor 92 and the base electrode of the transistor 91 is a further coupling circuit 94, the latter including the features of the aforedescribed coupling circuit. Connected in the load circuit of the transistor 91 is a load resistor 95 while coupled in the load circuit of the transistor 92 is a load resistor 96.

Coupled to the output circuit of the transistor 91 is a gating circuit 97 while coupled to the output of the transistor 92 is a gating circuit 98. The output of the gating circuit 97 is by way of an inductor 99 while the output of the gating circuit 98 is by way of output inductor 100. These inductors 99 and 100 serve the same purpose as inductors 84 and 86 in FIGURE 2.

Connected to the input base electrodes of the transistors 91 and 92 are a pair of input terminals 101 and 102, the latter being provided to set the bistable circuit 90 into the desired state.

The output inductors 99 and 100 are arranged to supply control signals for a further bistable circuit 105, the latter including a pair of transistors 106 and 107. This latter bistable circuit 105 is comprised of the same basic components as the bistable circuit 90 and includes a cross coupling circuit 108 coupling the output of the transistor 106 to the input of the transistor 107, and a further cross coupling circuit 109 coupling the output of the transistor 107 to the input of the transistor 106. A gating circuit 110 is connected to the output of the transistor 106 while a further gating circuit 111 is connected to the output of the transistor 107. An output inductor 112 is coupled to the output of the gating circuit 110 while a further inductor 113 is coupled to the output of the gating circuit 111. These inductors are adapted for connection to further the bistable circuits of the same basic type illustrated.

Considering the operation of the circuit of FIGURE 3, it is first assumed that information is written into the bistable circuit 90. It is further assumed that a "one" will be stored in the bistable circuit 90 when the transistor 91 is conducting and the transistor 92 is nonconducting. In order to set the circuit 90 into the "one" state, a negative pulse is applied to the input terminals 101 through the coupling diode associated therewith to the base electrode of the transistor 91. This negative pulse will be effective to cause the transistor 91 to become conducting. With the transistor 91 conducting, a grounding signal will be applied to the base electrode of the transistor 92 to render this transistor nonconducting. Once the bistable circuit has been set, it will remain in this condition until such time as an input is received to switch the state. Such an input would be applied to the input terminal 102.

In order to shift the information from the bistable circuit 90, a readout signal will be applied to the gating circuits 97 and 98 by way of the input terminals 103. This shifting signal will take the form of a negative pulse. Under the assumed conditions with transistor 91 conducting and transistor 92 nonconducting, the only gating circuit conditioned to pass a signal will be the gating circuit 98. Consequently, with a negative signal applied to both of the diodes on the input of the gating circuit 98, an output negative signal will be passed through the inductor 100 to the base electrode of the transistor 106. The negative signal will be effective to cause the transistor 106 to become conducting and when it does become conducting, the cross coupling circuit 108 will be effective to switch the transistor 107 to the nonconducting state. Thus, by definition, it may be said that the bistable circuit 105 is now set to the "one" state to correspond to the state of the preceding bistable circuit 90.

In order to read the information out of the bistable circuit 105, it is necessary to apply a negative shifting pulse to the input terminals 114 and the information will then move out by way of either of the inductors 112 or 113 to the next storage circuit of the register.

In the normal type of shift register, the shifting circuit will be operated by the simultaneous application to the input terminals 103 and 114 of a negative shifting pulse. This will have the effect of shifting information along through the register with the shift at each stage being synchronized with the next in order to prevent any superposition or loss of information.

Figure 4:
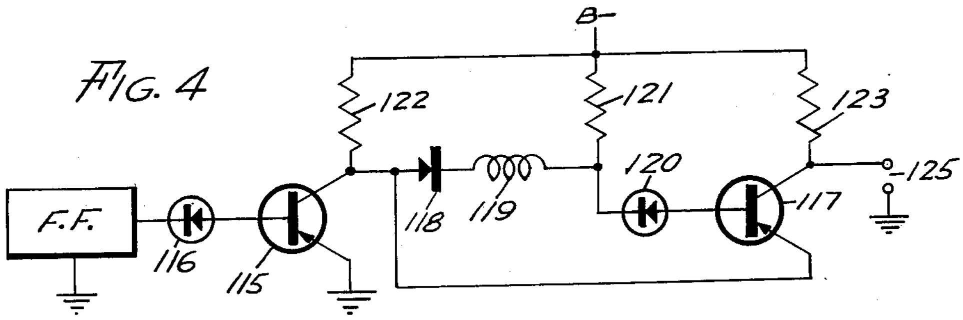
FIGURE 4 illustrates a circuit for use in the output of a flip-flop whereby a single pulse may be produced from a step voltage from a flip-flop.
Figure 5:
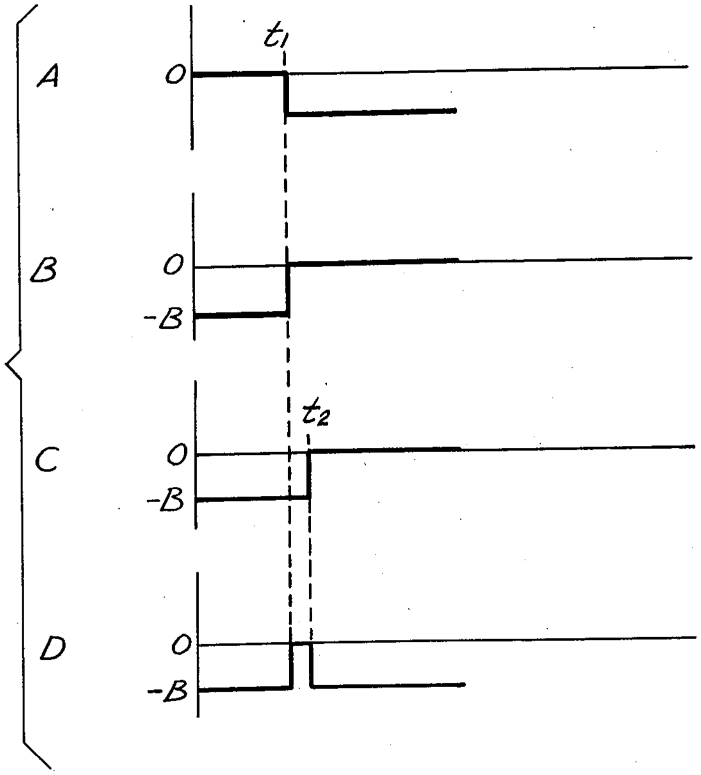
FIGURE 5 illustrates wave-forms associated with the circuit of FIGURE 4.

Referring now to FIGURE 4, there is here illustrated a form of circuitry which is adapted for use in producing a single output pulse from a bistable circuit or flip-flop as it is switched from one bistable state to the other. The normal output of the flip-flop will be a series of relatively long time square wave signals depending upon the rate at which the circuit is switched. Each individual signal at the time of switching normally takes the form of a direct current step as illustrated in FIGURES 5A and 5B. The circuit of FIGURE 4 has been arranged to take advantage of the unique coupling circuit used in the present invention to produce a single output pulse from an input step signal.

More specifically, the circuit of FIGURE 4 comprises an input transistor 115 having an input diode 116 coupled to the base electrode thereof. The circuit also includes an output transistor 117. Coupled between the collector electrode of the transistor 115 and the input base electrode of the transistor 117 is the new and novel input circuit utilized in the circuits of FIGURES 2 and 3, and this comprises a germanium diode 118, an inductor 119 and a silicon diode 120 all coupled in series. A resistor 121 is coupled to the junction between the diodes and the negative power supply terminal. A load resistor 122 is connected to the collector electrode of the transistor 115 while a further load resistor 123 is coupled to the collector electrode of the transistor 117.

In considering the operation of FIGURE 4, it is assumed that the wave form present on the input of the diode 116 is as illustrated in FIGURE 5A and is a signal having zero amplitude until time T1 when the signal suddenly goes negative. With zero potential on the base electrode of the transistor 115, the collector electrode on the lower end of the resistor 122 will have a negative potential thereon which is substantially equal to the negative B minus potential of the circuit. As soon as the negative potential on the input of the transistor 115 is applied, the transistor 115 will become conductive to effectively ground the lower terminal of the resistor 122. When the transistor 115 becomes conductive, this will establish a current flow path for the transistor 117 so that this transistor will be able to conduct. The circuit for this may be traced from the ground terminal through the collector-emitter circuit of the transistor 115, the emitter-collector circuit of the transistor 117, and the load resistor 123 to the B minus terminal. Since the transistors 115 and 117 have substantially zero internal impedance when conducting in saturation, the output terminals 125 will have substantially zero potential thereon with the potential having been suddenly changed from the B minus potential on the lower terminal resistor 123 to the ground potential in the manner illustrated at time T1 in FIGURE 5D.

After a time delay, which is a function of the size of the inductor 119, the ground signal applied to the coupling circuit including the diode 118 and inductor 119 and diode 120 will be reflected through to effectively ground the base electrode of the transistor 117. The grounding of this base electrode will be effective to cut the transistor off and the potential on the output terminals will return to the negative potential through the B minus power supply terminal. Thus, the grounding signal for the base electrode of the transistor 117 will appear on the base electrode as indicated time-wise in FIGURE 5C at time T2. Consequently, with this signal reflected through to the transistor, the output pulse on the output terminals 125 will appear as illustrated in FIGURE 5D.

It will be readily apparent that the pulse produced may be considered as the differentiated result of the square wave with the step wave applied to the input of the circuit. The output pulse on the terminal 155 may be used in any desired manner for controlling further switching functions in other bistable circuits, such as illustrated in FIGURES 1 through 3.

From the foregoing discussion, it will be readily apparent that the present circuit techniques are adapted for use in numerous applications and logical circuits in addition to those illustrated. These applications may well be in the fields of communication, data processing, data reduction and the like.

While, in accordance with the provisions of the statutes, there has been illustrated and described the best forms of the invention known, it will be apparent to those skilled in the art that changes may be made in the forms of the apparatus as disclosed without departing from the spirit of the invention as set forth in the appended claims, and that in some cases certain features of the invention may be used to advantage without a corresponding use of other features.

Having now described the invention, what is claimed as new and for which it is desired to secure by Letters Patent is:

1. A bistable electronic circuit comprising a pair of electronic switches each having input and output terminals, a first signal coupling circuit connected between the output of one of said electronic switches and the input of the other of said electronic switches, and a second signal coupling circuit connected between the output of the other of said electronic switches and the input of said one electronic switch, said first and second signal coupling circuits each comprising an electrical junction, a silicon diode connected between said junction and an input terminal of one of said electronic switches, a germanium diode connected between an output terminal of the other of said electronic switches and said junction, a resistor, a biasing source of power, and means including said resistor connecting said biasing source of power to said junction so that an electrical current will flow through either said silicon diode or said germanium diode.

2. A bistable electronic circuit comprising a pair of electronic switches each having input and output terminals, a first signal coupling circuit connected between the output of one of said electronic switches and the input of the other of said electronic switches, a second signal coupling circuit connected between the output of the other of said electronic switches and the input of said one electronic switch, said first and second signal coupling circuits each comprising an electrical junction, a first diode having a predetermined threshold of conduction connected between an output terminal of one of said electronic switches and said junction, a second diode having a threshold of conduction different from said first diode connected between said junction and an input terminal of the other of said electronic switches, a control potential source coupled to the junction of each of said coupling circuits so that an electrical current will flow through one or the other of the diodes in said circuits and means for changing the bistable state of said bistable circuit comprising a further electronic switch means connected to said junctions.

3. A bistable circuit comprising a first pair of diodes having dissimilar thresholds of conduction connected together at a first common junction, a second pair of diodes having dissimilar thresholds of conduction connected together at a second common junction, a power supply terminal, means connecting each of said junctions of the diodes of said first and second pair of diodes to said power supply terminal, a pair of electronic switches having input and output terminals, means connecting an output terminal of one of said switches to a diode of said first pair of diodes, means connecting an output terminal of the other of said switches to a diode of said second pair of diodes, and means connecting the input terminals of said switches each to the other diode of the pair of diodes connected to the output terminal of the other switch.

4. A bistable circuit comprising a first pair of diodes having dissimilar thresholds of conduction connected together at a first common junction, a second pair of diodes having dissimilar thresholds of conduction connected together at a second common junction, a power supply terminal, means connecting each of said junctions of the diodes of said first and second pair of diodes to said power supply terminal, a pair of electronic switches having input and output terminals, means connecting an output terminal of one of said switches to a diode of said first pair of diodes, means connecting an output terminal of the other of said switches to a diode of said second pair of diodes, means connecting the input terminals of said switches each to the other diode of the pair of diodes connected to the output terminal of the other switch, and a further electronic switch means connected in signal shunting relation to the input terminals of said pair of electronic switches.

5. A bistable circuit comprising a first pair of diodes having dissimilar thresholds of conduction connected together at a first common junction, a second pair of diodes having dissimilar thresholds of conduction connected together at a second common junction, a power supply terminal, means connecting said junctions of the diodes of said first and second pair of diodes to said power supply terminal, a pair of electronic switches comprising transistors having an input base terminal and output terminals, means connecting an output terminal of one of said switches to a diode of said first pair of diodes, means connecting an output terminal of the other of said switches to a diode of said second pair of diodes, and means connecting the base terminals of said switches each to the other diode of the pair of diodes connected to the output terminal of the other switch.

6. A bistable circuit comprising a first pair of diodes having dissimilar thresholds of conduction connected together at a first common junction, a second pair of diodes having dissimilar thresholds of conduction connected together at a second common junction, a power supply terminal, means connecting said junctions of the diodes of said first and second pair of diodes to said power supply terminal, a pair of transistor devices having an input base terminal and an output terminal, means connecting an output terminal of one of said transistor devices to a diode of said first pair of diodes, means connecting an output terminal of the other of said transistor devices to a diode of said second pair of diodes, means connecting the base terminals of said transistor devices each to the other diode of the pair of diodes connected to the output terminal of the other transistor, and a pair of semi-conductor signal input devices each connected to one of said base terminals.

7. An electrical apparatus as defined in claim 6 wherein said pair of semi-conductor devices comprises a further pair of transistor devices each having its respective terminals connected in a series circuit to the base terminal of one or the other of said first pair of transistor devices, and a control transistor device having its output terminals connected in series with the output terminals of said further pair of transistor devices, each of said further pair of transistor devices and said control transistor having an input control signal terminal.

8. In an output circuit for a bistable electronic circuit including a pair of output terminals, the combination comprising a first pair of signal gating circuits having outputs on which will appear signals when the associated gating circuits are activated, one of said gating circuits having an input connected to one of said output terminals and the other of said gating circuits having an input connected to the other of said output terminals, a read-out signal circuit connected to a further input of each of said gating circuits, a pair of signal lines, one each connected to the outputs of said pair of signal gating circuits, a second pair of signal gating circuits having control inputs, means connecting one of said second pair of signal gating circuits between one of said pair of output terminals and one of said pair of signal lines, means connecting the other of said second pair of signal gating circuits between the other of said pair of output terminals and the other of said signal lines so that the signals on said pair of output terminals may be reversed in their relation on said pair of signal lines when compared with said first pair of gating circuits and a second read-out signal circuit connected to the inputs of said second pair of gating circuits.

9. In an output circuit for a bistable electronic circuit including a pair of output terminals, the combination comprising a first pair of signal gating circuits each having a pair of input terminals and an output terminal, one input terminal of each pair being connected to one of said output terminals, a read-out signal circuit adapted to be selectively connected to the other input terminal of each of said gating circuits, a pair of signal lines, one each connected to the outputs of said pair of signal gating circuits, a second pair of signal gating circuits each having a pair of input terminals and an output terminal, means connecting an input terminal of each of said second pair to the other output terminal of said electronic circuit, a further read-out signal circuit means connected to be selectively coupled to the other input terminals of said second pair of gating circuits, and means connecting the outputs of said second pair of gating circuits one each, to said pair of signal lines so that when said second pair of gating circuits is activated the output coupled to said signal lines will be the reverse of the output when said first gating circuits are activated.

10. A digital signal storage circuit comprising a pair of signal transfer lines, a bistable signal circuit having a pair of output terminals and a pair of input terminals, a pair of signal gating circuit means, one each of said gating circuit means connecting an output terminal of said bistable signal circuit to one of said signal transfer lines, and further gating circuit means connecting said signal transfer lines to said input terminals.

11. A digital signal storage circuit comprising a pair of signal transfer lines, a bistable signal circuit having a pair of output terminals and a pair of input terminals, a pair of signal gating circuit means each having an output, one each of said gating circuit means connecting an output terminal of said bistable signal circuit to one of said signal transfer lines, circuit means connecting said signal transfer lines to said input terminals, an asymmetrically conducting device of a first type having a first threshold of conduction connected in the output of each of said gating circuits, and an asymmetrically conducting device of a second type having a second threshold of conduction substantially different than said first threshold connected in the circuit means between said input terminals and said signal transfer lines.

12. A digital signal storage circuit comprising a pair of signal transfer lines, a bistable signal circuit having a pair of output terminals and a pair of input terminals, a pair of signal coupling circuit means each having an output, one each of said coupling circuit means connecting an output terminal of said bistable signal circuit to one of said signal transfer lines, gating circuit means connecting said signal transfer lines to said input terminals, a germanium diode connected in series with the output of each of said coupling circuit means, and a silicon diode connected in the gating circuit means between each of said input terminals and each of said signal transfer lines.

13. A digital signal storage circuit comprising a pair of signal transfer lines; a plurality of bistable signal circuit means, each of said circuit means having a pair of output pling circuit means, one each of each pair of said coupling circuit means connecting an output terminal of the associated bistable signal circuit to one of said signal transfer lines, and circuit means connecting said signal transfer lines to said input terminals; and signal circuit means connected to each of said plurality of bistable signal circuit means to effect a transfer of information from one of said plurality of bistable signal circuit means to another by way of said pair of signal transfer lines.

14. A bistable signal storage circuit comprising a flip-flop having a pair of input terminals and a pair of output terminals, an input circuit connected to switch said flip-flop from one bistable state to the other upon receipt of successive input signals at a common input, said input circuit comprising a pair of signal gating circuits each having a pair of input diodes and an output diode, said input diodes being of a first type and having a first conducting threshold and said output diode being of a second type and having a second conducting threshold, means connecting an input signal source to one of said input diodes on both of said pair of gating circuits, means connecting the output terminals of said flip-flop to the other of said input diodes of said gating circuits, and means connecting said output diodes, one each to the input terminals of said flip-flop.

15. A bistable signal storage circuit comprising a flip-flop having a pair of input terminals and a pair of output terminals, an input circuit connected to switch said flip-flop from one bistable state to the other upon receipt of successive input signals at a common input, said input circuit comprising a pair of signal gating circuits each having a pair of input diodes and an output diode, said input diodes having a first conducting threshold and said output diode having a second conducting threshold, means connecting an input signal source to one of said input diodes on both of said pair of gating circuits, means connecting the output terminals of said flip-flop to the other input diodes of said gating circuits, a pair of inductors, and means connecting said output diodes, one each to the input terminals of said flip-flop by way of a circuit including one of said inductors.

16. A bistable signal storage circuit comprising a flip-flop having a pair of input terminals and a pair of output terminals, an input circuit connected to switch said flip-flop from one bistable state to the other upon receipt of successive input signals at a common input, said input circuit comprising a pair of signal gating circuits each having a par of input germanium diodes and an output silicon diode, means connecting an input signal source to one of said input diodes on both of said pair of gating circuits, means connecting the output terminals of said flip-flop to the other input diodes of said gating circuits, and means connecting said output diodes, one each to the input terminals of said flip-flop.

17. A bistable signal storage circuit comprising a first flip-flop having a pair of input terminals and a pair of output terminals, an input circuit connected to switch said flip-flop from one bistable state to the other upon receipt of successive input signals at a common input, said input circuit comprising a pair of signal gating circuits each having a pair of input diodes and an output diode, said input diodes having a first conducting threshold and said output diode having a second conducting threshold, means connecting an input signal source to one of said input diodes on both of said pair of gating circuits, means connecting the output terminals of said flip-flop to the other input diodes of said gating circuits, a second flip-flop having a pair of input terminals, and means connecting said output diodes, one each to the input terminals of said second flip-flop.

18. A circuit as claimed in claim 17 wherein a pair of inductors are connected one each in series with the output diodes of said pair of gating circuits.

19. A bistable electrical circuit comprising a first transistor having base, emitter, and collector electrodes, a second transistor having base, emitter and collector electrodes, a first coupling circuit comprising a pair of diodes having different thresholds of conduction connected with one terminal of each joined together at a junction and the other terminals of each completing a connection between the collector electrode of said first transistor and the base electrode of said second transistor, a second coupling circuit comprising a pair of diodes having dissimilar thresholds of conduction connected with one terminal of each joined together at a junction and the other terminals of each completing a connection between the collector electrode of said second transistor and the base electrode of said first transistor, a first power supply terminal, a first resistor connected to said first named coupling circuit at the junction between said diodes and to said first power supply terminal, a second resistor connected to said second named coupling circuit between the junction of said diodes and said supply terminal, a third resistor, a fourth resistor, means connecting said third resistor between the collector electrode of said first transistor and said power supply terminal, means connecting said fourth resistor between said collector electrode of said second transistor and said power supply terminal, and means connecting the emitter electrodes of said first and second transistors to a second potential source terminal directly related to said first named supply terminal.

20. A bistable electrical circuit comprising a first transistor having a base, emitter, and collector electrodes, a second transistor having a base, emitter and collector electrodes, a first coupling circuit comprising a pair of diodes having differing thresholds of conduction connected with one terminal of each joined together at a junction and the other terminals of each completing a connection between the collector electrode of said first transistor and the base electrode of said second transistor, a second coupling circuit comprising a pair of diodes having differing thresholds of conduction connected with one terminal of each joined together at a junction and the other terminals of each completing a connection between the collector electrode of said second transistor and the base electrode of said first transistor, a first power supply terminal, a first resistor connected to said first named coupling circuit at the junction between said diodes and to said power supply terminal, a second resistor connected to said second named coupling circuit between the junction of said diodes and said supply terminal, a third resistor, a fourth resistor, means connecting said third resistor between the collector electrode of said first transistor and said power supply terminal, means connecting said fourth resistor between said collector electrode of said second transistor and said power supply terminal, means connecting the emitter electrodes of said first and second transistors to a second potential source terminal directly related to said first named supply terminal, a third transistor having base, emitter and collector electrodes, a fourth transistor having base, emitter and collector electrodes, means connecting the collector electrode of said third transistor to the base electrode of said first transistor, means connecting the collector electrode of said fourth transistor to the base electrode of said second transistor, and signal input terminals connected to the base electrodes of said third and fourth transistors.

21. A bistable electrical circuit comprising a first transistor having base, emitter, and collector electrodes, a second transistor having base, emitter and collector electrodes, a first coupling circuit comprising a silicon diode and a germanium diode connected with one terminal of each joined together at a junction and the other terminals of each completing a connection between the collector electrode of said first transistor and the base electrode of said second transistor, a second coupling circuit comprising a silicon diode and a germanium diode connected with one terminal of each joined together at a junction and the other terminals of each completing a connection between the collector electrode of said second transistor and the base electrode of said first transistor, a first power supply terminal, a first resistor connected to said first named coupling circuit at the junction between said diodes and to said first power supply terminal, a second resistor connected to said second named coupling circuit between the junction of said diodes and said supply terminal, a third resistor, a fourth resistor, means connecting said third resistor between the collector electrode of said first transistor and said power supply terminal, means connecting said fourth resistor between said collector electrode of said second transistor and said power supply terminal, and means connecting the emitter electrodes of said first and second transistors to a second potential source terminal directly related to said first named supply terminal.

22. A bistable electrical circuit comprising a first transistor having base, emitter, and collector electrodes, a second transistor having base, emitter and collector electrodes, a first coupling circuit comprising a silicon diode and a germanium diode connected with one terminal of each joined together at a junction and the other terminals of each completing a connection between the collector electrode of said first transistor and the base electrode of said second transistor, a second coupling circuit comprising a silicon diode and a germanium diode connected with one terminal of each joined together at a junction and the other terminals of each completing a connection between the collector electrode of said second transistor and the base electrode of said first transistor, a first power supply terminal, a first resistor connected to said first named coupling circuit at the junction between said diodes and to said first power supply terminal, a second resistor connected to said second named coupling circuit between the junction of said diodes and said supply terminal, a third resistor, a fourth resistor, means connecting said third resistor between the collector electrode of said first transistor and said power supply terminal, means connecting said fourth resistor between said collector electrode of said second transistor and said power supply terminal, means connecting the emitter electrodes of said first and second transistors to a second potential source terminal directly related to said first named supply terminal, a third transistor having base, emitter and collector electrodes, a fourth transistor having base, emitter and collector electrodes, means connecting the collector electrode of said third transistor to the base electrode of said first transistor, means connecting the collector electrode of said fourth transistor to the base electrode of said second transistor, and signal input terminals connected to the base electrodes of said third and fourth transistors, a fifth transistor having base, emitter and collector electrodes, means connecting the collector electrode of said fifth transistor to the emitter electrodes of said third and fourth transistors, and a further control signal source connected to the base electrode of said fifth transistor.

23. A digital data handling circuit comprising a plurality of bistable circuits, each of said circuits having a pair of input and output terminals, a pair of signal transfer lines being connected to transfer signals from one of said plurality of bistable circuits to another, means connecting one input terminal and one output terminal of each bistable circuit to one of said signal transfer lines, means connecting the other input terminal and other output terminal of said circuit to the other of said signal transfer lines, and control means connected to said bistable circuits and said transfer lines to couple signals out of one of said bistable circuits to another bistable circuit.

24. A bistable electronic circuit comprising a pair of electronic switches each having input control and output terminals, power supply terminals connected to said output terminals, a first circuit connected between an output terminal of one of said electronic switches and an input control terminal of the other of said electronic switches, and a second circuit connected between an output terminal of the other of said electronic switches and an input control terminal of said one electronic switch, said first and second circuits each comprising an electrical junction, a first diode having a predetermined threshold of conduction connected between an output terminal of one of said electronic switches and said junction, a second diode having a threshold of conduction different than said first diode connected between said junction and an input terminal of the other of said electronic switches, and signal control means connected to said junction to control the flow of current from said junction through either said first diode or said second diode.

25. A bistable electronic circuit comprising a pair of electronic switches each having input and output terminals, a first signal-coupling circuit connected between an output terminal of one of said electronic switches and an input terminal of the other of said electronic switches, a second signal-coupling circuit connected between an output terminal of the other of said electronic switches and an input terminal of said one electronic switch, said first and second signal-coupling circuits each comprising an electrical junction, a first diode having a predetermined threshold of conduction connected between an output terminal of one of said elelectronic switches and said junction, a second diode having a threshold of conduction different than said first diode connected between said junction and an input terminal of the other of said electronic switches, and a potential supply source electrically coupled to said junction so that an electrical current will flow from said source through either said first or said second diode.

References Cited in the file of this patent

UNITED STATES PATENTS

| | | |
|---|---|---|
| 2,577,186 | Hamacher | June 19, 1951 |
| 2,569,345 | Shea | Sept. 25, 1951 |
| 2,580,771 | Harper | Jan. 1, 1952 |
| 2,644,887 | Wolfe | July 7, 1953 |
| 2,665,845 | Trent | Jan. 12, 1954 |
| 2,719,228 | Aurbach et al. | Sept. 27, 1955 |
| 2,735,005 | Steele | Feb. 14, 1956 |
| 2,777,956 | Kretzmer | Jan. 15, 1957 |
| 2,793,303 | Fleisher | May 21, 1957 |
| 2,801,334 | Clapper | July 30, 1957 |
| 2,806,139 | Le Clerc | Sept. 10, 1957 |
| 2,806,153 | Walker | Sept. 10, 1957 |
| 2,808,203 | Geyer et al. | Oct. 1, 1957 |
| 2,816,223 | Nelson | Dec. 10, 1957 |
| 2,816,226 | Forrest | Dec. 19, 1957 |
| 2,831,986 | Sumner | Apr. 22, 1958 |
| 2,854,651 | Kircher | Sept. 30, 1958 |
| 2,954,485 | Blair | Sept. 27, 1960 |
| 2,965,767 | Wanlass | Dec. 20, 1960 |
| 3,010,031 | Baker | Nov. 21, 1961 |

FOREIGN PATENTS

| | | |
|---|---|---|
| 166,800 | Australia | Apr. 8, 1954 |

OTHER REFERENCES

Electronics, June 1955, pages 132–136, "Directly Coupled Transistor Circuits," Beter et al.